US006492309B1

(12) United States Patent
Behr et al.

(10) Patent No.: US 6,492,309 B1
(45) Date of Patent: Dec. 10, 2002

(54) FLUORINATED SOLVENT COMPOSITIONS CONTAINING HYDROGEN FLUORIDE

(75) Inventors: Frederick E. Behr, Woodbury, MN (US); Paul E. Rajtar, Hugo, MN (US); Lawrence A. Zazzera, Edina, MN (US); Michael J. Parent, Oakdale, MN (US); Silva K. Theiss, Woodbury, MN (US); Billy L. Weaver, Eagan, MN (US)

(73) Assignee: 3M Innovative Properties Company, Saint Paul, MN (US)

( * ) Notice: Subject to any disclaimer, the term of this patent is extended or adjusted under 35 U.S.C. 154(b) by 172 days.

(21) Appl. No.: 09/698,690

(22) Filed: Oct. 27, 2000

Related U.S. Application Data

(63) Continuation-in-part of application No. 09/541,453, filed on Mar. 31, 2000, now Pat. No. 6,310,018.

(51) Int. Cl.$^7$ .......................... C09K 13/00; C11D 7/52
(52) U.S. Cl. .......................... 510/175; 510/176; 134/2; 134/3; 252/79.3; 252/79.4; 438/718
(58) Field of Search .................. 134/1.1, 1.3, 2, 134/3; 216/37, 57, 66; 252/79.4, 79.3; 438/265, 305, 385, 396, 622, 623, 625, 695, 711, 718, 723; 510/175, 176

(56) References Cited

U.S. PATENT DOCUMENTS

| | | | |
|---|---|---|---|
| 4,055,458 A | * 10/1977 | Niederprum et al. | |
| 4,582,624 A | * 4/1986 | Enjo et al. | |
| 4,795,582 A | * 1/1989 | Ohmi et al. | |
| 5,478,436 A | * 12/1995 | Wineburger et al. | |
| 5,571,447 A | * 11/1996 | Ward et al. | |
| 5,603,750 A | 2/1997 | Sierakowski et al. | 75/743 |
| 5,658,962 A | 8/1997 | Moore et al. | 521/114 |
| 5,750,797 A | 5/1998 | Vitcak et al. | 568/683 |
| 5,755,989 A | * 5/1998 | Ishii et al. | |
| 5,962,390 A | 10/1999 | Flynn et al. | 510/286 |
| 6,001,796 A | 12/1999 | Pham et al. | 510/408 |
| 6,310,018 B1 | * 10/2001 | Behr et al. | |

FOREIGN PATENT DOCUMENTS

| | | |
|---|---|---|
| CA | 2245155 | 3/1999 |
| DE | 1294949 | 5/1969 |
| FR | 2287432 | 6/1976 |
| GB | 1037857 | 8/1966 |
| JP | 5-029235 | 2/1994 |
| JP | 6-293686 | 10/1994 |
| WO | WO 99/15845 | 4/1999 |
| WO | WO 99/47480 | 9/1999 |

OTHER PUBLICATIONS

W.F. Linke, "Solubilities, Inorganic and Metal–Organic Compounds", A–Ir, *American Chemical Society*, vol. I, 4$^{th}$ Ed., (1958) pp. 1123–1124.
"Hydrogen", *Kirk–Othmer Encyclopedia of Chem. Tech.*, vol. 11, 4$^{th}$ Ed., John Wiley & Sons, pp. 355–376, (1994).
B. Froeschle et al., "In–Line X–Ray Photoelectron Spectroscopy for Anhydrous Hydrogen Fluoride Cleaning Optimization", *Electrochemical Society Proceedings*, vol. 97–35, (1998), pp. 415–422.
J.H. Simons, "Hydrogen Fluoride", Fluorine Chemistry, *Academic Press Inc*, vol. 1, (1950), pp. 225–259.
H.H. Hyman et al., "Liquid Hydrogen Fluoride", Non–Aqueous Solvent Systems, *Academic Press*, (1965), pp. 47–81.

(List continued on next page.)

*Primary Examiner*—Gregory E. Webb
(74) *Attorney, Agent, or Firm*—Kent S. Kokko

(57) ABSTRACT

A homogeneous compositions containing a fluorinated solvent, hydrogen fluoride, and an optional co-solvent, and the use of these compositions for etching of microelectromechanical devices is described.

17 Claims, 2 Drawing Sheets

OTHER PUBLICATIONS

R. Maboudian et al., "Critical Review: Adhesion in surface micromechanical structures", *J. Vac. Sci. Technol. B*, 15(1), (1997) pp. 1–20.

G.A. Olah et al., "Fluorination with Onium Poly(hydrogen fluorides): The Taming Of Anhydrous Hydrogen Fluoride For Synthesis", *Synthetic Fluorine Chemistry*, John Wiley and Sons, N.Y., N.Y., 163–204, (1992).

M. Hudlicky et al., "Chemistry of Organic Fluorine Compounds II", ACS Monograph 187, *American Chemical Society*, Washington D.C., (1995) pp. 120–132.

B.N. Ellis, "Cleaning and Contamination of Electronic Components and Assemblies", *Electrochemical Publications Limited*, Ayr, Scotland, (1986) pp. 182–194.

J.S. Jeon et al., "Characterization of HF–Last Cleaned Si For Gate Oxides", *Electrochem Soc. Proceedings*, vol. 97–35, (1997) pp. 195–206.

Koester et al., "MUMPs™ Design Handbook", Revision 5.0, (2000) pp. 1–38.

* cited by examiner

FLUORINATED SOLVENT COMPOSITIONS CONTAINING HYDROGEN FLUORIDE

This is a continuation-in-part of application Ser. No. 09/541,453, filed Mar. 31, 2000 now U.S. Pat. No. 6,310,018.

FIELD OF INVENTION

This invention relates to homogeneous compositions containing a fluorinated solvent, hydrogen fluoride, and a co-solvent and the use of these compositions in cleaning and processing semiconductors and integrated circuits including silicon and Ga/As substrates.

BACKGROUND

The use of microelectronic devices, such as integrated circuits, flat panel displays and micro electromechanical systems, has burgeoned in new business and consumer electronic equipment, such as personal computers, cellular phones, electronic calendars, personal digital assistants, and medical electronics. Such devices have also become an integral part of more established consumer products such as televisions, stereo components and automobiles.

These devices in turn contain one or more very high quality semiconductor chips made from silicon wafers containing many layers of circuit patterns. Typically nearly 350 processing steps are required to convert a bare silicon wafer surface to a semiconductor chip of sufficient complexity and quality to be used, for example, in high performance logic devices found in today's personal computers. The most common processing steps of semiconductor chip manufacture are wafer-cleaning steps, accounting for over 10% of the total processing steps. These cleaning steps are normally one of two types: oxidative and etch. During oxidative cleaning steps, oxidative compositions are used to oxidize the silicon or polysilicon surface, typically by contacting the wafer with aqueous peroxide or ozone solution. During etch cleaning steps, etching compositions are used to remove native and deposited silicon oxide films and organic contaminants from the silicon or polysilicon surface before gate oxidation or epitaxial deposition, typically by contacting the wafer with aqueous acid. See, for example, L. A. Zazzera and J. F. Moulder, *J. Electrochem. Soc.*, 136, No. 2, 484 (1989). The ultimate performance of the resulting semiconductor chip will depend greatly on how well each cleaning step has been conducted.

Microelectromechanical systems (MEMS) (also called micromachines or micromechanical devices) are small mechanical devices that can be made using traditional integrated circuit manufacturing techniques. Typical devices include motors, gears, accelerometers, pressure sensors, actuators, mirrors, personal information carriers, biochips, micropumps and valves, flow sensor and implantable medical devices and systems. The manufacture of MEMS results in a chip, or die, which contains the moving pieces of the device made from silicon or polycrystalline silicon (polysilicon) encased in silicon oxide. The die can also contain the circuitry necessary to run the device. One of the final steps in the manufacture of MEMS is commonly referred to as release-etch and consists of an aqueous etch utilizing hydrofluoric acid (HF) to remove the silicon oxide to free, or release, the silicon or polysilicon pieces and allow them to move.

For etch cleaning steps, the composition of choice has been dilute aqueous hydrofluoric acid (HF) and, to a lesser extent, hydrochloric acid (HCl). Currently, many semiconductor fabricators employ an "HF-last" etch cleaning process consisting of an etching step using dilute aqueous HF to etch oxides.

Another important cleaning process in semiconductor chip manufacture is the removal of residues left behind from plasma ashing or etching of dielectric, photoresist or metals. The removal of these "post-etch residues" is challenging because of their multicomponent nature (i.e., the residues are typically comprised of both organic and inorganic compounds) and because the residues are adjacent to sensitive device features that must not be damaged during residue removal. Etch cleaning processes directed at removing "post-etch residues" will often utilize an aqueous HF composition in a first step, followed by a multi-step process to remove inorganic components of the residue. For instance, ethylene glycol-HF-$NH_4F$ aqueous solutions are widely used for the removal of "post-etch residues" from metal lines, and dilute aqueous HF is often used to remove cap and side wall veil residues after shallow trench isolation etching. See, for example, S. Y. M. Chooi et al., *Electrochem. Soc., Proceedings*, "Sixth International Symposium on Cleaning Technology in Semiconductor Device Manufacturing," 99–35 (1999).

However, etch cleaning of silicon surfaces with aqueous HF compositions has presented many problems to the semiconductor chip manufacturer. For example, contact with aqueous HF compositions renders the silicon surface hydrophobic and thus very susceptible to contamination by particles such as silicon oxides and other inorganic and organic materials. To remove these particles, the etched wafer is typically rinsed with deionized water, ethyl alcohol or isopropyl alcohol and is dried prior to subsequent processing. Unfortunately, the rinse does not always effectively remove these residual particles from the wafer, as the low energy silicon wafer surface is not easily wet by aqueous or alcoholic rinsing compositions which inherently have high surface tensions. In addition, rinsing with deionized water gives rise to slow drying time, while rinsing with alcohol introduces a potential fire hazard.

Another problem with employing aqueous HF compositions for etch cleaning is the slow rate of etching realized, possibly caused by deactivation of HF by water. To overcome this slow etch rate, most aqueous HF etching compositions need to incorporate at least 0.5% HF by weight. The slow etch rate of aqueous HF solutions can be of particular importance for MEMS devices. Silicon oxide dimensions in MEMS vary but are typically on the order of 1 $\mu$m thick with lateral dimensions of 10–500 $\mu$m. Slower etch rates lead to longer processing times. Etch assist holes are often added to polysilicon structures for which large, thin regions of silicon oxide must be removed, such as for the release of micro-mirrors, in order to accommodate the slow etch rate of aqueous HF solutions and reduce etch times. The etch assist holes may adversely affect the ultimate device performance.

The compositions of the present invention may be used to prepare MEMS devices having a large critical etch dimension. The critical etch dimension is that distance that the etchant must travel to dissolve all the polysilicate glass and release the device from the silicon wafer. The present compositions can be used to release devices having a critical etch distance of 400 micrometers or more, and are preferably used to etch and release devices having a critical etch distance of 40 to 400 micrometers.

SUMMARY OF THE INVENTION

In one aspect, this invention relates to a cleaning composition useful in semiconductor and integrated circuit manufacture, the composition comprising a fluorinated solvent, hydrogen fluoride or onium complex thereof, and sufficient amount of a co-solvent to form a homogeneous mixture. Advantageously, the present invention provides a liquid substrate cleaning composition useful for etching, removal of residues, rinsing and drying that contains a relatively low concentration of HF, but has an efficient rate of etching. The present composition may also be rendered non-flammable by appropriate selection of the fluorinated solvent. Substrates useful in the present invention include silicon, germanium, GaAs, InP and other III–V and II–VI compound semiconductors. It will be understood, due to the large number of processing steps involved in integrated circuit manufacture, that the substrate may include layers of silicon, polysilicon, metals and oxides thereof, resists, masks and dielectrics.

The present invention is also particularly useful in the etch and release of microelectromechanical devices. The etch cleaning and drying of MEMS has similar issues to those for semiconductor chip manufacture. Particulate contamination on micromachines can hinder movement of the device and ultimately affect device performance or cause failure. Care is taken to rinse the device with deionized water followed by ethyl alcohol or isopropanol, particles are not easily removed from microelectromechanical devices due to the polysilicon surface energy and intricate designs.

In addition to the problem of particulate contamination, drying of MEMS following deionized water rinses or alcohol rinses can lead to a phenomenon known as stiction. Stiction can be described as the adhesion of two surfaces due to adhesives forces as well as frictional forces. Polysilicon devices are typically 0.2–4.0 $\mu$m, but can range up to hundreds of $\mu$m, with lateral dimensions anywhere from 1–500 $\mu$m. The high surface area of these structures along with the tight tolerances between structures makes stiction a very troublesome problem. Stiction of microdevices can occur during use of the device or as a result of capillary effects during the drying of the device following the release etch process. See, for example, R. Maboudian and R. T. Howe, $J.\ Vac.\ Sci.\ Technol.\ B$, 15(1), 1–20 (1997). The high surface tensions of the aqueous or alcoholic rinses can greatly exacerbate the capillary effects and lead to a higher incidence of microstructure stiction following the release-etch and drying steps.

In yet another aspect, this invention relates to a cleaning process for silicon or polysilicon part in MEMS chip with a homogeneous cleaning composition comprising a fluorinated solvent, HF and co-solvent. The present invention provides a wafer cleaning composition with low surface tension that easily penetrates the intricate microstructures and wets the surfaces on MEMS substrates. The cleaning composition is easily removed from MEMS and provides a dry, hydrophobic surface without residual or trapped water that could be present from a high surface tension aqueous cleaning composition. In contrast to the prior art, the present invention provides a method for the etch and release of microelectromechanical devices that etches and releases MEMS with no, or fewer, etch assist holes in MEMs device. Additionally the composition etches and releases while preventing or reducing stiction between said MEMs elements.

As used herein, "micromechanical device" refers to micrometer-sized mechanical, optomechanical, electromechanical, or optoelectromechanical device. Various technology for fabricating micromechanical devices is available using the Multi-User MEMS Processes (MUMPs) from Cronos Integrated Microsystems located at Research Triangle Park, North Carolina. One description of the assembly procedure is described in "MUMs Design Handbook", revision 5.0 (2000) available from Cronos Integrated Microsystems.

Polysilicon surface micromachining adapts planar fabrication process steps known to the integrated circuit (IC) industry to manufacture microelectromechanical or micromechanical devices. The standard building-block processes for polysilicon surface micromachining are deposition and photolithographic patterning of alternate layers of low-stress polycrystalline silicon (also referred to as polysilicon) and a sacrificial material (e.g., silicon dioxide or a silicate glass). Vias etched through the sacrificial layers at predetermined locations provide anchor points to a substrate and mechanical and electrical interconnections between the polysilicon layers. Functional elements of the device are built up layer by layer using a series of deposition and patterning process steps. After the device structure is completed, it can be released for movement by removing the sacrificial material using a selective etchant such as hydrofluoric acid (HF) which does not substantially attack the polysilicon layers.

The result is a construction system generally consisting of a first layer of polysilicon which provides electrical interconnections and/or a voltage reference plane, and additional layers of mechanical polysilicon which can be used to form functional elements ranging from simple cantilevered beams to complex electromechanical systems. The entire structure is located in-plane with the substrate. As used herein, the term "in-plane" refers to a configuration generally parallel to the surface of the substrate and the terms "out-of-plane" refer to a configuration greater than zero degrees to about ninety degrees relative to the surface of the substrate.

Typical in-plane lateral dimensions of the functional elements can range from one micrometer to several hundred micrometers, while the layer thicknesses are typically about 1–2 micrometers. Because the entire process is based on standard IC fabrication technology, a large number of fully assembled devices can be batch-fabricated on a silicon substrate without any need for piece-part assembly.

The present composition may also make advantageous use of hydrogen fluoride onium complexes, discussed in greater detail below, which are safer and more easily handled that anhydrous hydrogen fluoride. Thus in the present invention, hydrogen fluoride will be used to denote both anhydrous hydrogen fluoride as well as the onium complexes of hydrogen fluoride.

In yet another aspect, this invention relates to a cleaning process for substrates comprising contacting a substrate with a homogeneous cleaning composition comprising a fluorinated solvent, hydrogen fluoride (or onium complex thereof); and sufficient amount of a co-solvent to form a homogeneous mixture; and separating the cleaning composition from the processed substrate. The cleaning process makes more efficient use of the available HF than conventional aqueous processes and achieves an etch cleaning rate comparable to that of conventional aqueous HF compositions but with a relatively low HF concentration. The lower HF concentrations thus improve product safety while reducing adverse environmental impact.

In yet another aspect, this invention relates to a method for terminating the etching process performed by a hydrogen fluoride-containing etching composition, the method comprising the steps of: (1) providing a substrate; (2) contacting the substrate with a cleaning composition comprising hydrogen fluoride, a fluorinated solvent; and sufficient amount of a co-solvent to form a homogeneous mixture; (3) allowing sufficient time for the composition to etch the substrate to the desired extent; and (4) adding a sufficient amount of an alcohol to the etching composition to terminate the etching process.

DETAILED DESCRIPTION

Figure 1:
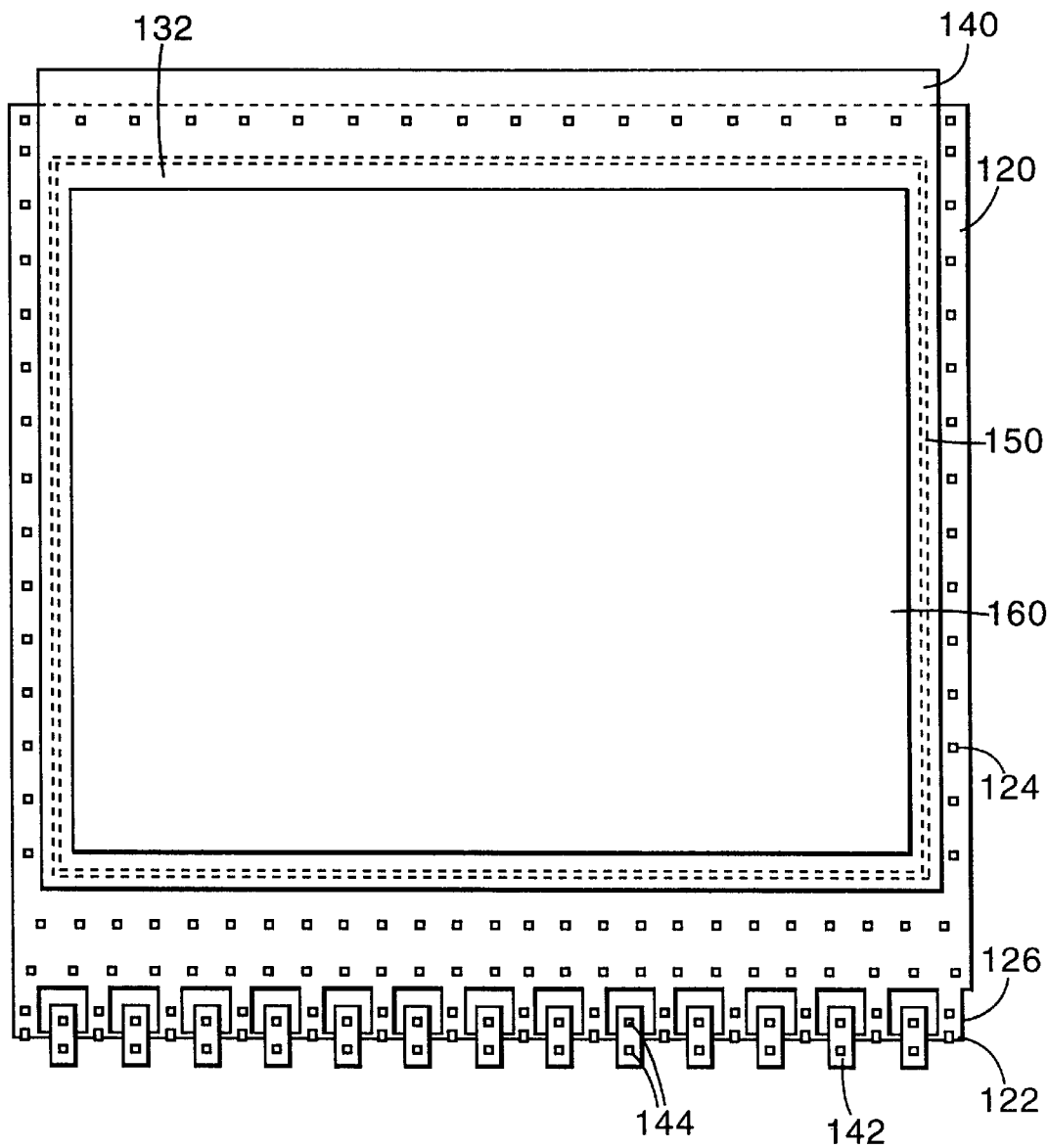
FIG. 1 is a planar view of an unreleased microelectromechanical device used in the Examples.

Compositions of this invention, comprising a fluorinated solvent, hydrogen fluoride and a co-solvent are useful in the various cleaning operations performed on substrates such as those that may be required for subsequent operations in the manufactures of semiconductors. As used herein "cleaning" of substrates will refer to any of etching, removal of residues and/or particulates, rinsing and drying. As used herein "substrate" will refer to wafers and chips used in semiconductor manufacture, including silicon, germanium, GaAs, InP and other III–V and II–VI compound semiconductors. The compositions can effectively remove both inorganic particles, such as silicon oxides and other inorganic oxides, and organic residues, such as oils and greases, from the silicon wafer surface to expose a hydrophobic silicon surface and additionally convert hydrophilic silicon oxides to hydrophobic silicon hydrides. As a result, many of these cleaning steps (e.g., etching, rinsing and drying) can be combined into a single step. Additionally the present composition is useful in the removal of "post-etch residues" left behind from plasma ashing or etching of dielectric, photoresist or metals.

The cleaning composition and method of this invention can improve manufacturing efficiency by lowering defects to increase wafer yield, or by decreasing cleaning times to increase wafer production. Further advantages of this invention include: (1) reduced processing time due to fewer chemical processing steps required; (2) reduced flammability of the cleaning compositions (e.g., as compared to compositions containing high levels of isopropyl alcohol); (3) elimination of aqueous HF rinsing steps that can leave particles on the wafer surface; (4) less particles remaining on "HF last" treated substrates, possibly due to improved wetting of the substrate; (5) better removal of residues having both inorganic and organic components; and (6) faster etching rates than realized with conventional etch cleaning processes employing aqueous HF etching compositions of the same HF concentration and (7) less corrosive relative prior art aqueous systems.

The improved performance is due in part to the low surface tension and low viscosity of the fluorinated solvents used. The low surface tension contributes to the improved wetting of the surfaces, and the low viscosity contributes to improved separation of the processed substrate from the cleaning composition, better draining of the composition from the surface, and more efficient evaporation of the residue from the surface. The surface tensions of the fluorinated solvents are generally less than 20 dynes/cm and preferably between 10 and 20 dynes/cm when measured at 25° C. The viscosity values are generally less than 5, and preferably less than 1 centistokes at 25° C.

The compositions of this invention are preferably nonflammable, which is defined herein as having a flash point of greater than about 140° F. (about 60° C.) when tested according to ASTM D3278-89. Because the compositions may be used in the cleaning and processing of electronic devices, it is preferred that all components of the composition be highly pure and have low concentrations of particulates, metals and non-volatile residues. In particular, the fluorinated solvents used in the composition and process of the invention should have less than 3 particles (of greater than 5.0 micron diameter) /ml, less that 5000 parts per trillion of metals and less than 250 parts per trillion of non-volatile residues.

The HF may be neat, or may be used in the form of an onium complex. Anhydrous hydrogen fluoride has a boiling point of 19.5° C., and is most often provided in pressurized cylinders. Because of the high vapor pressure and acidity, anhydrous HF may be difficult to handle, requiring special precautions and equipment. To overcome these difficulties, it is convenient to use HF in the form of stable complexes of electron pair donor bases. Such complexes, known as "onium poly(hydrogen fluorides)" have the general formula $BH^+ (HF)_xF^-$, where B is an electron-pair donor base and x is an integer generally from 1 to 10, and include oxonium-, ammonium-, pyridinium-, and phosphonium- poly (hydrogen fluorides). Such onium complexes are less volatile, less corrosive, and are normally liquids at room temperatures. Many such onium complexes are stable liquids that resist the loss of HF even during distillation. Pyridinium poly(hydrogen fluoride), known as Olah's Reagent is a preferred onium complex. Further information regarding useful onium complexes may be found in *Synthetic Fluorine Chemistry*, George A. Olah, et al, editors, "Fluorination with Onium Poly(hydrogen fluorides): the taming of anhydrous hydrogen fluoride for synthesis", John Wiley and Sons, New York, N.Y., pp. 163–204.

The HF useful in compositions and processes of this invention, whether anhydrous HF or an onium complex, is preferably essentially anhydrous (i.e., contain no more than about 0.1% water by weight based on weight of HF) and is preferably substantially free of other contaminants such as metals, particulates and non-volatile residues in order to effectively clean the silicon surface at the maximum rate during the manufacturing process. The hydrogen fluoride, or onium complex, is generally added to the composition in amounts of 2 wt. % HF or less. Ammonium complexes having a higher $pK_b$, such as pyridinium having a $pK_b$ of 8.8, is generally preferred for etching processes.

The co-solvent used in the invention provides a homogeneous composition by dissolving both the fluorinated solvent and the HF (whether anhydrous HF or an onium complex). The co-solvent is selected by solubility and to be substantially non-reactive toward the HF under the conditions of use, including temperature and pressure. Useful co-solvents include aliphatic and aromatic hydrocarbons, ethers, polyethers, carboxylic acids including acetic, trifluoroacetic, trichloroacetic, chloroacetic acids, primary and secondary alcohols, including phenolic alcohols, and hydrochlorocarbons.

Representative examples of co-solvents which can be used in the cleaning composition include methanol, ethanol, isopropanol, sec-butyl alcohol, methyl t-butyl ether, methyl t-amyl ether, 1,2- dimethoxyethane, cyclohexane, 2,2,4-trimethylpentane, n-decane, trans-1,2-dichloroethylene, methylcyclopentane, decalin, 2-butanone, methyl isobutyl ketone, naphthalene, toluene, methylene chloride, chlorocyclohexane, and 1-chlorobutane.

By "substantially non-reactive" it is meant that the co-solvent does not react with the HF at an appreciable rate, or that etching is not significantly retarded. Alcohols are a preferred co-solvent and include primary and secondary aliphatic alcohols, and phenolics including mixtures thereof. The co-solvent should be relatively volatile to facilitate evaporation from a silicon surface, with those having a boiling point. of 120° C. or less being preferred, and is preferably substantially free of other contaminants such as metals, particulates and non-volatile residues in order to effectively clean the silicon surface at the maximum rate during the manufacturing process.

The co-solvent is added to the composition in amounts sufficient to provide a homogeneous solution. Generally the co-solvent will comprise 30 wt. % or less of the composition.

Fluorinated solvents useful in compositions of this invention should be chosen such that a non-flammable homogeneous composition can be formulated which contains up to about 2% by weight of HF (as HF or an onium complex) and up to about 30% by weight of co-solvent. For rapid evaporation during the drying step, the fluorinated solvent should have a boiling point of less than about 120° C. at atmospheric pressure. It is believed that the very low surface energy of the fluorinated solvents renders the composition much more effective as a cleaning composition: the low surface tension of fluorinated solvents effectively wet the substrates much more readily than the conventional aqueous and alcoholic compositions of the prior art. Useful fluorinated solvents meeting these criteria include hydrofluoroethers (HFEs), hydrofluorocarbons (HFCs), hydrohalofluoroethers (HHFEs) and hydrochlorofluorocarbons (HCFCs).

The fluorinated solvents of the present invention comprise nonionic, partially fluorinated hydrocarbons that may be linear, branched, or cyclic, and optionally may contain one or more additional catenary heteroatoms, such as nitrogen or oxygen. The fluorinated solvent may be selected from the group consisting of partially-fluorinated alkanes, amines, ethers, and aromatic compounds. The fluorinated solvent is non-functional, i.e. lacking functional groups that are polymerizable, reactive toward acids, bases, oxidizing agents, reducing agents or nucleophiles. Preferably, the number of fluorine atoms exceeds the number of hydrogen atoms in the fluorinated solvents. To be non-flammable, the relationship between the number of fluorine, hydrogen, and carbon atoms can preferably be related in that the number of fluorine atoms is equal to or exceeds the sum of the number of number of hydrogen atoms and carbon-carbon bonds:

F atoms ≧ (# H atoms+# C—C bonds).

The fluorinated solvents are partially or incompletely fluorinated, i.e. contain at least one aliphatic hydrogen atom. Perfluorinated compounds, since they lack chlorine atoms, are not ozone-depleting agents, but these compounds may exhibit a global warming potential (GWP) due to their long atmospheric lifetimes, and are generally not good solvents for hydrogen fluoride. It is preferred that the fluorinated solvent contains at least one aliphatic or aromatic hydrogen atom in the molecule. These compounds generally are thermally and chemically stable, yet are much more environmentally acceptable in that they degrade in the atmosphere and thus have a low global warming potential, in addition to a zero ozone depletion potential, and better solvency properties.

Partially fluorinated liquids, containing one or more aliphatic or aromatic hydrogen atoms, may be employed as the fluorinated solvents of the invention. Such liquids typically contain from 3 to 20 carbon atoms and may optionally contain one or more catenary heteroatoms, such as divalent oxygen or trivalent nitrogen atoms. Useful partially fluorinated solvents include cyclic and non-cyclic fluorinated alkanes, amines, ethers, and any mixture or mixtures thereof Preferably, the number of fluorine atoms exceeds the number of hydrogen atoms and more preferably the number of fluorine atoms is equal to or exceeds the sum of the number of combined hydrogen atoms and carbon-carbon bonds. Although not preferred, due to environmental concerns, the partially fluorinated solvents optionally may contain one or more chlorine atoms provided that where such chlorine atoms are present there are at least two hydrogen atoms on the geminal or adjacent carbon atom(s).

One class of partially fluorinated liquids useful as fluorinated solvents are hydrofluorocarbons; i.e. compounds having only carbon, hydrogen and fluorine, and optionally catenary divalent oxygen and/or trivalent nitrogen. Such compounds are nonionic, may be linear or branched, cyclic or acyclic. Such compounds are of the formula $C_nH_mF_{2n+2-m}$, where n is from about 3 to 20 inclusive, m is at least one, and where one or more non-adjacent —$CF_2$— groups may be replaced with catenary oxygen or trivalent nitrogen atoms. Preferably the number of fluorine atoms is equal to or greater than the number of hydrogen atoms, and more preferably the number of fluorine atoms is equal to or exceeds the sum of the combined number of hydrogen atoms and carbon-carbon bonds of fluorine atoms.

A preferred class of hydrofluorocarbon liquids particularly useful to form the composition of the invention comprises hydrofluoroethers of the general formula:

$(R_1—O)_n—R_2$        (I)

where, in reference to Formula I, n is a number from 1 to 3 inclusive and $R_1$ and $R_2$ are the same or are different from one another and are selected from the group consisting of alkyl, aryl, and alkylaryl groups and their derivatives. At least one of $R_1$ and $R_2$ contains at least one fluorine atom, and at least one of $R_1$ and $R_2$ contains at least one hydrogen atom. $R_1$ and $R_2$ may also be linear, branched, cyclic or acyclic and optionally, one or both of $R_1$ and $R_2$ may contain one or more catenary heteroatoms, such as trivalent nitrogen or divalent oxygen. Preferably the number of fluorine atoms is equal to or greater than the number of hydrogen atoms, and more preferably more preferably the number of fluorine atoms is equal to or exceeds the sum of the number of combined number of hydrogen atoms and carbon-carbon bonds. Although not preferred, due to environmental concerns, $R_1$ or $R_2$ or both of them optionally may contain one or more chlorine atoms provided that where such chlorine atoms are present there are at least two hydrogen atoms on the $R_1$ or $R_2$ group on which they are present.

More preferably, the compositions of the present invention are prepared with hydrofluoroethers of the formula:

$R_f—O—R$        (II)

where, in reference to Formula II above, $R_f$ and R are as defined for $R_1$ and $R_2$ of Formula I, except that $R_f$ contains at least one fluorine atom, and R contains no fluorine atoms. Such ethers may be described as segregated ethers in that the fluorinated carbons are segregated from the non-fluorinated carbons by the ether oxygen atom. More preferably, R is an acyclic branched or straight chain alkyl group, such as methyl, ethyl, n-propyl, iso-propyl, n-butyl, i-butyl, or t-butyl, and $R_f$ is preferably a fluorinated derivative of a cyclic or acyclic, branched or straight chain alkyl group having from 3 to about 14 carbon atoms, such as n-$C_4F_9$—, i-$C_4F_9$—, i-$C_3F_7$, (n-$C_3F_7$)CF— or cyclo-$C_6F_{11}$—. $R_f$ may optionally contain one or more catenary heteroatoms, such as trivalent nitrogen or divalent oxygen atoms.

In a preferred embodiment, $R_1$ and $R_2$, or $R_f$ and R, are chosen so that the compound has at least three carbon atoms, and the total number of hydrogen atoms in the compound is at most equal to the number of fluorine atoms. In the most preferred embodiment, $R_1$ and $R_2$ or $R_f$ and R are chosen so that the compound has at least three carbon atoms, and more preferably number of fluorine atoms is equal to or exceeds the sum of the number of combined hydrogen atoms and carbon-carbon bonds.

Representative compounds described by Formula II useful in the present invention include, but are not limited to, the following compounds:

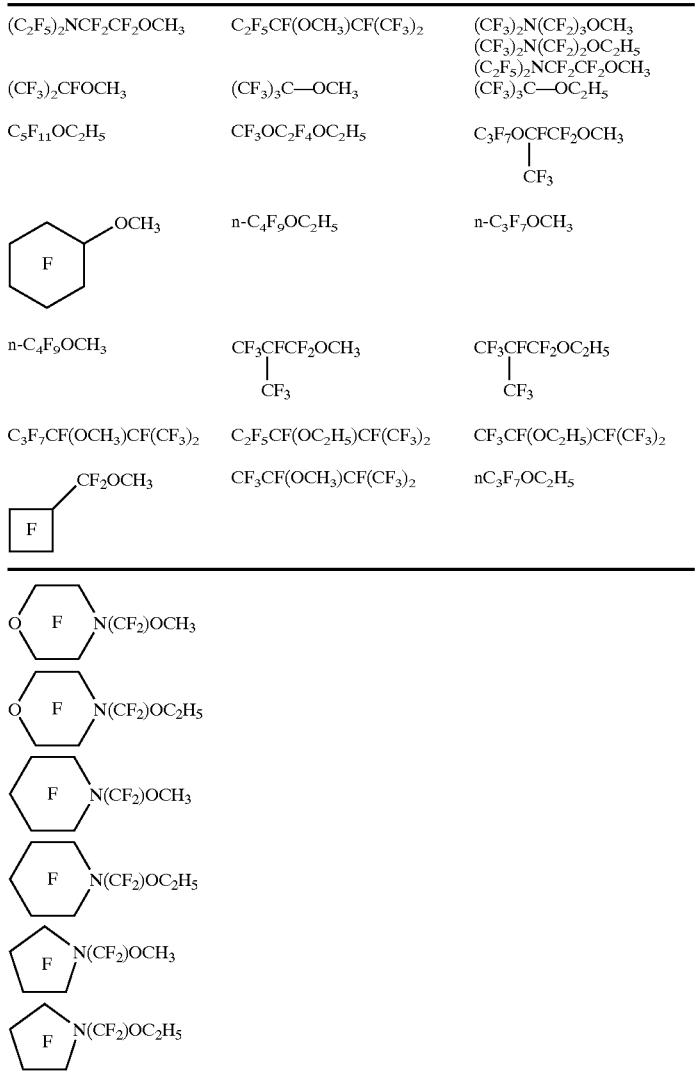

wherein cyclic structures designated with an interior "F" are perfluorinated.

Particularly preferred segregated hydrofluoroethers of Formula II include n-$C_3F_7OCH_3$, $(CF_3)_2CFOCH_3$, n-$C_4F_9OCH_3$, $(CF_3)_2CFCF_2OCH_3$, n-$C_3F_7OC_2H_5$, n-$C_4F_9OC_2H_5$, $(CF_3)_2CFCF_2OC_2H_5$, $(CF_3)_3COCH_3$, $(CF_3)_3COC_2H_5$, and mixtures thereof. Segregated hydrofluoroethers are available as 3M™ NOVEC™ HFE-7100 and HFE-7200 Engineered Fluids from Minnesota Mining and Manufacturing Company, St. Paul, Minn.

A number of synthetic routes to hydrofluoroethers are known. These methods may be broadly divided into two groups; methods of fluorinating an ether compound, and methods where the ether linkage is formed within a compound by reaction with a fluorine-containing precursor. The former methods include: (1) direct fluorination of an ether compound; and (2) electrochemical fluorination of an ether compound. The latter methods include: (3) the addition reaction of an alcohol to a fluorinated olefin; (4) alkylation of a partially fluorinated alcohol; and (5) non-catalytic alkylation of a fluorinated carbonyl compound with a suitable alkylating agent. Japanese Patent No. JP 6-293686 provides a partial summary description of these varied methods.

The segregated hydrofluoroethers (alkoxy-substituted perfluorocompounds) suitable for use in the process of the invention can be prepared by alkylation of perfluorinated alkoxides prepared by the reaction of the corresponding perfluorinated acyl fluoride or perfluorinated ketone with an anhydrous alkali metal fluoride (e.g., potassium fluoride or cesium fluoride) or anhydrous silver fluoride in an anhydrous polar, aprotic solvent. (See, e.g., the preparative methods described in French Patent Publication No. 2,287,432, German Patent Publication No. 1,294,949, and U.S. Pat. No. 5,750,797 (Flynn et al.). Alternatively, a fluorinated tertiary alcohol can be allowed to react with a base, e.g., potassium hydroxide or sodium hydride, to produce a perfluorinated tertiary alkoxide which can then be alkylated by reaction with alkylating agent.

Suitable alkylating agents for use in the preparation include dialkyl sulfates (e.g., dimethyl sulfate), alkyl halides (e.g., methyl iodide), alkyl p-toluenesulfonates (e.g., methyl p-toluenesulfonate), alkyl perfluoroalkanesulfonates (e.g., methyl perfluoromethanesulfonate), and the like. Suitable polar, aprotic solvents include acyclic ethers such as diethyl ether, ethylene glycol dimethyl ether, and diethylene glycol dimethyl ether; carboxylic acid esters such as methyl formate, ethyl formate, methyl acetate, diethyl carbonate, propylene carbonate, and ethylene carbonate; alkyl nitrites such as acetonitrile; alkyl amides such as N,N-dimethylformamide, N,N-diethylformamide, and N-methylpyrrolidone; alkyl sulfoxides such as dimethyl sulfoxide; alkyl sulfones such as dimethylsulfone, tetramethylene sulfone, and other sulfolanes; oxazolidones such as N-methyl-2-oxazolidone; and mixtures thereof.

As yet another alternative, the fluorinated ethers may be prepared by reacting a fluorinated carbonyl compound, such as a ketone or acid fluoride, with an alkylating agent in the presence of a Lewis acid catalyst as described in WO 99/47480 (Lamanna et al.).

Useful non-segregated hydrofluoroethers include alpha-, beta- and omega-substituted hydrofluoroalkyl ethers such as those described in U.S. Pat. No. 5,658,962 (Moore et al.), incorporated herein by reference, which can be described by the general structure shown in Formula III:

$$X-[R_f'-O]_y R''H \quad (III)$$

wherein:

X is either F, H, or a perfluoroalkyl group containing from 1 to 3 carbon atoms;

each $R_f'$ is independently selected from the group consisting of $-CF_2-$, $-C_2F_4-$, and $-C_3F_6-$;

R" is a divalent organic radical having from 1 to about 3 carbon atoms, and is preferably perfluorinated; and y is an integer from 1 to 7, preferably from 1 to 3;

wherein when X is F, R" contains at least one F atom, and wherein the sum of the number of carbon atoms in the $R_f'$ group(s) and the number of carbon atoms in the R" group is between 4 and about 8.

Representative compounds described by Formula III useful in the present invention include, but are not limited to, the following compounds:

| | | |
|---|---|---|
| $HCF_2OCF_2OCF_2H$ | $HCF_2OCF_2OC_2F_4OCF_2H$ | $C_3F_7OCH_2F$ |
| $HCF_2OC_2F_4OCF_2H$ | $HCF_2OCF_2OCF_2OCF_2H$ | $HCF_2OC_2F_4OC_2F_4OCF_2H$ |
| $HC_3F_6OCH_3$ | $HC_3F_6OC_3F_6H$ | $C_4F_9OC_2F_4H$ |
| $C_5F_{11}OC_2F_4H$ | $C_6F_{13}OCF_2H$ | and |
| $C_3F_7O[CF(CF_3)CF_2O]_pCF(CF_3)H$, wherein p = 0 to 1 | | |

Preferred non-flammable, non-segregated hydrofluoroethers include $C_4F_9OC_2F_4H$, $C_6F_{13}OCF_2H$, $HC_3F_6OC_3F_6H$, $C_3F_7OCH_2F$, $HCF_2OCF_2OCF_2H$, $HCF_2OCF_2CF_2OCF_2H$, $HC_3F_6OCH_3$, $HCF_2OCF_2OC_2F_4OCF_2H$, and mixtures thereof. Non-segregated hydrofluoroethers specialty liquids are available from Ausimont Corp., Milano, Italy, under the GALDEN H™.

Useful fluorinated solvents also include hydrofluorocarbons (HFCs) having a 3- to 8-carbon backbone. The carbon backbone can be straight, branched, cyclic, or mixtures of these. Useful HFCs include compounds having more than approximately 5 molar percent fluorine substitution, or less than about 95 molar percent fluorine substitution, based on the total number of hydrogen and fluorine atoms bonded to carbon, but having essentially no substitution with other atoms (e.g., chlorine). Useful HFCs can be selected from compounds of Formula IV:

$$C_nH_mF_{2n+2-m}, \quad (IV)$$

wherein n is at least 3, and m is at least one.

Representative compounds of Formula IV include $CF_3CH_2CF_2H$, $CF_2HCF_2CH_2F$, $CH_2FCF_2CFH_2$, $CF_2HCH_2CF_2H$, $CF_2HCFHCF_2H$, $CF_3CFHCF_3$, and $CF_3CH_2CF_3$; $CHF_2(CF_2)_2CF_2H$, $CF_3CF_2CH_2CH_2F$, $CF_3CH_2CF_2CH_2F$, $CH_3CHFCF_2CF_3$, $CF_3CH_2CH_2CF_3$, $CH_2FCF_2CF_2CH_2F$, $CF_3CH_2CF_2CH_2CH_3$, $CHF_2CH(CF_3)CF_3$, and $CHF(CF_3)CF_2CF_3$; $CF_3CH_2CHFCF_2CF_3$, $CF_3CHFCH_2CF_2CF_3$, $CF_3CH_2CF_2CH_2CF_3$, $CF_3CHFCHFCF_2CF_3$, $CF_3CH_2CH_2CF_2CF_3$, $CH_3CHFCF_2CF_2CF_3$, $CF_3CF_2CF_2CH_2CH_3$, $CH_3CF_2CF_2CH_2CH_3$, $CH_3CF_2CF_2CF_2CF_3$, $CF_3CH_2CHFCH_2CF_3$, $CH_2FCF_2CF_2CF_2CF_3$, $CHF_2CF_2CF_2CF_2CF_3$, $CH_3CF(CHFCHF_2)CF_3$, $CH_3CH(CF_2CF_3)CF_3$, $CHF_2CH(CHF_2)CF_2CF_3$, $CHF_2CF(CHF_2)CF_2CF_3$, and $CHF_2CF_2CF(CF_3)_2$ $CHF_2(CF_2)_4CF_2H$, $(CF_3CH_2)_2CHCF_3$, $CH_3CHFCF_2CHFCHFCF_3$, $HCF_2CHFCF_2CF_2CHFCF_2H$, $H_2CFCF_2CF_2CF_2CF_2CF_2H$, $CHF_2CF_2CF_2CF_2CF_2CHF_2$, $CH_3CF(CF_2H)CHFCHFCF_3$, $CH_3CF(CF_3)CHFCHFCF_3$, $CH_3CF(CF_3)CF_2CF_2CF_3$, $CHF_2CF_2CH(CF_3)CF_2CF_3$, and $CHF_2CF_2CF(CF_3)CF_2CF_3$; $CH_3CHFCH_2CF_2CHFCF_2CF_3$, $CH_3(CF_2)_5CH_3$, $CH_3CH_2(CF_2)_4CF_3$, $CF_3CH_2CH_2(CF_2)_3CF_3$, $CH_2FCF_2CHF(CF_2)_3CF_3$, $CF_3CF_2CF_2CHFCHFCF_2CF_3$, $CF_3CF_2CF_2CHFCF_2CF_3$, $CH_3CH(CF_3)CF_2CF_2CF_3$, $CH_3CF(CF_2CF_3)CH_2CFHCF_2CF_3$, $CH_3CF(CF_2CF_3)CHFCF_2CF_3$, $CH_3CH_2CH(CF_3)CF_2CF_2CF_3$, $CHF_2CF(CF_3)(CF_2)_3CH_2F$, $CH_3CF_2C(CF_3)_2CF_2CH_3$, $CHF_2CF(CF_3)(CF_2)_3CF_3$; $CH_3CH_2CH_2CH_2CF_2CF_2CF_2CF_3$, $CH_3(CH_2)_6CH_3$, $CHF_2CF(CF_3)(CF_2)_4CHF_2$, $CHF_2CF(CF_3)(CF_2)_4CHF_2$, $CH_3CH_2CH(CF_3)CF_2CF_2CF_2CF_3$, $CH_3CF(CF_2CF_3)CHFCF_2CF_2CF_3$, $CH_3CH_2CH_2CHFC(CF_3)_2CF_3$, $CH_3C(CF_3)_2CF_2CF_2CH_3$, $CH_3CH_2CH(CF_3)CF(CF_3)_2$ and $CH_2FCF_2CF_2CHF(CF_2)_3CF_3$.

Preferred HFCs include $CF_3CFHCFHCF_2CF_3$, $C_5F_{11}H$, $C_6F_{13}H$, $CF_3CH_2CF_2H$, $CF_3CF_2CH_2CH_2F$, $CHF_2CF_2CF_2CHF_2$, 1,2-dihydroperfluorocyclopentane and 1,1,2-trihydroperfluorocyclopentane. Useful HFCs include HFCs available under the VERTREL™, available from E. I. duPont de Nemours & Co. (e.g., $CF_3CHFCHFCF_2CF_3$);

under the ZEORORA-H™, available from Nippon Zeon Co. Ltd., Tokyo, Japan; and under the HFC designation from AlliedSignal Chemicals, Buffalo, N.Y.

Useful fluorinated solvents also include hydrohalofluoro ethers (HHFEs). For the present invention, HHFEs are defined as ether compounds containing fluorine, non-fluorine halogen (i.e., chlorine, bromine, and/or iodine) and hydrogen atoms. An important subclass of HHFEs is perfluoroalkylhaloethers (PFAHEs). PFAHEs are defined as segregated ether compounds having a perfluoroalkyl group and a haloalkyl group having carbon-bonded hydrogen atoms and halogen atoms, wherein at least one of the halogen atoms is chlorine, bromine, or iodine. Useful PFAHEs include those described by the general structure shown in Formula V:

$$R_f-O-C_aH_bF_cX_d \qquad (V)$$

wherein $R_f$ is a perfluoroalkyl group preferably having at least about 3 carbon atoms, most preferably from 3 to 6 carbon atoms, and optionally containing a catenary heteroatom such as nitrogen or oxygen; X is a halogen atom selected from the group consisting of bromine, iodine, and chlorine; "a" preferably is from about 1 to 6; "b" is at least 1; "c" can range from 0 to about 2; "d" is at least 1; and b+c+d is equal to 2a+1. Such PFAHEs are described in PCT Publication No. WO 99/14175, which is incorporated herein by reference. Useful PFAHEs include c-$C_6F_{11}$—$OCH_2Cl$, $(CF_3)_2CFOCHCl_2$, $(CF_3)_2CFOCH_2Cl$, $CF_3CF_2CF_2OCH_2Cl$, $CF_3CF_2CF_2OCHCl_2$, $(CF_3)_2CFCF_2OCHCl_2$, $(CF_3)_2CFCF_2OCH_2Cl$, $CF_3CF_2CF_2CF_2OCHCl_2$, $CF_3CF_2CF_2CF_2OCH_2Cl$, $(CF_3)_2CFCF_2OCHClCH_3$, $CF_3CF_2CF_2CF_2OCHClCH_3$, $(CF_3)_2CFCF(C_2F_5)OCH_2Cl$, $(CF_3)_2CFCF_2OCH_2Br$, and $CF_3CF_2CF_2OCH_2I$.

Useful fluorinated solvents also include HCFCs. For the present invention, HCFCs are defined as compounds containing a carbon backbone substituted with carbon-bound fluorine, chlorine, and hydrogen atoms. HCFCs useful as heat transfer fluids include $CF_3CHCl_2$, $CH_3CCl_2F$, $CF_3CF_2CHCl_2$ and $CClF_2CF_2CHClF$. However, in the long term, HCFCs may also be legislated out of production due to ozone layer degradation, albeit slower than the CFCs.

Concentrations of the anhydrous HF, co-solvent and fluorinated solvent components in the compositions of this invention can vary, depending upon the requirement of the substrate, such as amount of etching required or amount of particulate and/or residue removal. In a cleaning composition (i.e., the composition actually contacted with the substrate), useful concentration ranges are, by weight, about 0.005 to about 2% HF (as anhydrous HF or onium complex), about 0.01% to about 5% co-solvent, and about 93 to about 99.99% fluorinated solvent. Surprisingly, the rate of etching using a composition of the invention comprising 0.007 wt. % HF exceeds that of a commercial etching composition having 0.5% aqueous H. Preferably the concentration of HF is less than about 1 wt. % and more preferably less than about 0.1 wt. % HF.

The cleaning composition may conveniently be supplied as a concentrate having a relatively high proportion of co-solvent and HF relative to fluorinated solvent, which is then diluted prior to use by additional fluorinated solvent. Thus a concentrate composition may contain up to 10 wt. % co-solvent and up to 2 wt. % HF, which may be diluted to concentrations more suitable for end-use cleaning, and that are safer due to the lower HF concentration.

In the method of the invention, a silicon substrate is contacted with a composition comprising a fluorinated solvent, anhydrous hydrogen fluoride or complex thereof, and a sufficient amount of a co-solvent to provide a homogeneous mixture, for a time sufficient to clean the surface of the substrate. The cleaning method may be used to etch the surface to remove the hydrophilic silanol groups, remove particulates or residues, rinse and dry the surface or a combination of these. The method preferably comprises the additional step of separating the cleaned substrate from the cleaning composition.

Surprisingly, it has been found that etching may be quenched by addition of an excess amount of alcohol. The cleaning process may further include a termination step of adding excess alcohol to the composition. Generally such a termination requires a tenfold excess, by weight, of the alcohol relative to the HF.

The cleaning composition is used in the liquid state and any of the known techniques for "contacting" a substrate can be utilized. For example, a liquid cleaning composition can be sprayed, brushed or poured onto the substrate, or the substrate can be immersed in a liquid composition. Elevated temperatures, ultrasonic energy, and/or agitation can be used to facilitate the cleaning and etching. Various different solvent cleaning techniques are described by B. N. Ellis in Cleaning and Contamination of Electronics Components and Assemblies, Electrochemical Publications Limited, Ayr, Scotland, pages 182–94 (1986).

After contact, the substrate may be removed from the cleaning composition. Normally draining is sufficiently efficient to effect substantially complete removal of the cleaning composition from the surface of the substrate. This may be enhanced by the application of heat, agitation, air jets, or spinning the substrates (i.e. centrifugal removal processes) to effect more complete removal, as desired.

Additionally the cleaning process may further comprise a rinse step, to ensure complete removal of the HF (or onium complex) from the substrate. The substrate may be rinsed in any solvent known to be useful in the wafer manufacturing process. Although alcohols are conventionally chosen in the art to remove water, their use represents a potential fire hazard and it is preferred to rinse in a non-flammable fluorinated solvent such as those previously described. The fluorinated solvent used in the rinse may be the same as or different from the fluorinated liquid used in the cleaning compositions, and a mixture of solvents may be used. Preferably the fluorinated liquid used in a rinse step is the same as used in the cleaning composition.

Normally the compositions may be used for an extended period before replacement, renewal or purification is required. Such techniques including filtration to remove particulates, extraction to remove soluble residues or salts, distillation and decantation to recover the fluorinated solvent may be used. It will be noted that as a surface is cleaned, or etched in particular, the compositions begin to become contaminated. Removal of particulates and residues from the substrate leads to build up of these materials in the cleaning composition. In particular etching silicon produces both water and various silanols. As the concentration of water increases, it will eventually phase separate from the composition as a less dense, water-rich phase. This may be easily separated from the cleaning composition by techniques known in the art, such as decantation or use of a weir. The cleaning composition may then be recycled, especially the fluorinated solvent. It is generally not necessary or desirable to recover the co-solvent and HF from the spent cleaning compositions. These materials are present in small amounts and not easily recovered. It is generally more desirable to recover the fluorinated solvent and add new co-solvent and HF (or onium complex) thereto.

The present invention is useful in the etch and release of microelectromechanical devices, such as micromirrors. The method comprises the steps of providing a silicon wafer containing an unreleased device; contacting the wafer with the composition of this invention for a time sufficient to etch and release said device.

Micromirrors that are fabricated via the MEMS process are currently being used to switch optical signals in telecommunications networks. In the art, the process is similar to the process used to produce integrated circuits except the layers deposited to produce the structures being formed are thicker than in ICs. Because of these thicker layers, the critical etch distance is larger. In the final step of a MEMS process aqueous HF solution etches all of the oxide ($SiO_2$) off of the device. It will be understood there may be completely inaccessible oxide that remains: that which is encapsulated by the specific chosen design. Because the oxide is both under and over the unreleased device, the etchant must be able to reach all of the oxide for the MEMS device to release the device. To ensure that this "release" etch works, the current fabrication process provides design rules as to the maximum and minimum spacing of features on the MEMS device. In the case of a mirror the relatively large (250 μm on a side) piece of polysilicon must be perforated by holes to allow the etchant to get under the mirror and etch away the underlying oxide.

Using the design rules published by CRONOS of North Carolina, the spacing of these holes is to be no more than 30 μm. These same design rules force the opening of the hole to be a certain size. When making a mirror that consists of two polysilicon layers and a reflective gold layer the hole in the gold layer can be 11 um square. This can mean that ~13% of the reflective area of the micromirror is lost to the holes. This causes a loss in signal strength for the optical signal.

In the present invention, a micromirror may be prepared without these etch release holes by using the composition described herein. These novel, non-aqueous low surface tension compositions are non-aqueous, homogeneous solutions that offer many advantages over conventional aqueous HF etch systems for MEMS fabrication. One such benefit of these solutions is enhanced etch rates. Compositions of the invention containing 0.5% wt. HF may have approximately 50 times greater etch rate than aqueous etch processes at the same concentration. This can be especially important for MEMS fabrication due to the relatively large amount of silicon dioxide that needs to be removed during the release etch process compared to IC fabrication.

The non-aqueous etch solutions also have inherently low surface tension (generally less than 20 dynes/cm) and low viscosity (generally less than 0.6 cps). The fluorinated fluid can typically represent over 95% of the etch solution thus dominating the physical properties of the solution. Low surface tension coupled with the low viscosity allows the solution to wet and more readily penetrate the intricate MEMS structures than the conventional aqueous etch process. Following the release etch and rinse, the wafer can be dried directly without having to be rinsed by an intermediate solvent, such as isopropanol. The low surface tension of the composition greatly reduces capillary forces on drying that can lead to stiction problems for MEMS substrates.

The combination of higher etch rate combined with the low viscosity of the solution means that the current design rules on placement of etch holes can be reduced or eliminated. The resultant mirror would have greater area as result of eliminated the etch holes. This means that additional signal will be reflected off the micromirror. The additional signal strength can reduce the need for amplification after using a MEMS based switch. The change in signal strength is significant. In the original CRONOS design rules (size of etch holes=11×11 microns and the spacing of etch holes= 30×30 microns), the signal lost through the etch holes would equal about 13.4% or 0.63 dB.

EXAMPLES

The present invention will be further described with reference to the following non-limiting examples. All parts, percentages and ratios are by weight unless otherwise specified.

Etch Cleaning Compositions Evaluated

Composition A

A homogeneous non-aqueous cleaning composition was prepared by mixing together 2% anhydrous HF (available from Air Products & Chemicals, Allentown, PA.), 1.9% isopropyl alcohol (IPA), and 96.1% 3M™ HFE-7100 Specialty Liquid (a blend of approximately 60% methyl perfluoroisobutyl ether and 40% methyl perfluoro-n-butyl ether, available from 3M Company, St. Paul, Minn.). By titration, the actual percent HF was determined to be 1.64%.

Composition B

A homogeneous non-aqueous cleaning composition was prepared by mixing together 2.3% anhydrous HF, 2.3% ISOPROPANOL, 65.2% 3M™ HFE-7200 Specialty Liquid (a blend of approximately 60% ethyl perfluoroisobutyl ether, and 40% ethyl perfluoro-n-butyl ether, available from 3M Company), and 30.2% HFE-7100.

Composition C

A homogeneous non-aqueous cleaning composition was prepared by mixing together 2.3% anhydrous HF, 1.9% ISOPROPANOL, 65.5% VERTREL™ XF hydrofluorocarbon (2,3-dihydroperfluoropentane, available from E. I. DuPont de Nemours and Co., Wilmington, Del.), and 30.3% HFE-7100.

Composition D

A homogeneous non-aqueous cleaning composition was prepared by mixing together 2.0% anhydrous HF, 2.27% ethyl alcohol, 0.03% methyl alcohol, 30.3% VERTREL™ XF, and 65.4% HFE-7100.

Composition E

A homogeneous non-aqueous cleaning composition was prepared by mixing together 4.5% pyridine polyhydrofluoride (available from Aldrich Chemical Co., Milwaukee, Wis., 70% HF in complex), 4.8% ISOPROPANOL, and 90.7% 3M™ HFE-7100. (Pyridine has a $pK_b$ value of 8.8.)

Composition F

A homogeneous non-aqueous cleaning composition was prepared by mixing together 4.9% triethylamine trishydrofluoride (available from Aldrich Chemical Co., provides 1.8% HF to Composition F), 4.8% ISOPROPANOL, and 90.3% 3M™ HFE-7100. (Triethylamine has a $pK_b$ value of 3.4.)

Composition G

A non-aqueous cleaning composition was prepared by mixing together 0.2% ammonium bifluoride (available from Mallinckrodt, Inc., St. Louis, Mo. provides 0.07% HF to Composition G), 5.0% ISOPROPANOL, and 94.8% 3™ HFE-7100. (Ammonia has a $pK_b$ value of 4.8.)

Composition H (Comparative)

An aqueous HF etch cleaning composition was prepared by mixing together 1 part of 49% aqueous hydrofluoric acid (available from Aldrich Chemical Co.), and 100 parts of DI water. The resulting composition contained 0.49% active HF.

Composition I

A homogeneous non-aqueous cleaning composition was prepared by mixing together 1.3% HF (determined by titration), 1.9% ISOPROPANOL, and 96.8% 3™ HFE-7100 Specialty Liquid.

Test Procedures Used

Wafer Cleaning/Water Repellency Test Procedure

A 4 inch (100 mm) diameter silicon wafer, boron doped in the range of 30–60 ohm-cm with (100) orientation, single side polished, with a 200 angstrom layer of thermal silicon dioxide (available from MEMC Electronic Materials, St. Peters, Mo.), was diced into several small pieces, each piece approximately 20 mm×20 mm. One of the silicon wafer pieces was tested for hydrophilicity/hydrophobicity by gently placing a few drops of deionized (DI) water on the chip surface. The water drops beaded up on the chip surface, indicating hydrophobicity caused by hydrocarbon contamination of the oxidized wafer surface.

All the silicon wafer pieces were then cleaned using an oxidative cleaning process consisting of simultaneously treatment with ultraviolet light (UV) and ozone using a UV/ozone apparatus consisting of a 500 volt DC power supply and low pressure mercury grid lamp having quartz tubing (available from BHK Inc., Pomona, Calif.). The grid lamp was attached to a 5 in (13 cm)×5 in (13 cm) piece of polished aluminum that served as the top of the UV/ozone apparatus. Approximately 90% of the lamp intensity was at a wavelength of 254 nm, and approximately 5% was at 185 nm. The wafer pieces were placed on a mobile stage which was raised toward the lamp at the top of the UV/ozone apparatus until the pieces were at a distance of approximately 1 to 10 mm below the lamp. After approximately 5 minutes of exposure to the UV/ozone apparatus, one of the wafer pieces was removed and was re-tested for hydrophilicity/hydrophobicity using drops of DI water. The water drops wetted out the wafer surface, indicating that there was now a clean oxidized hydrophilic silicon oxide layer on the wafer surface.

A hydrophilic wafer piece was rinsed with a clean blend of 95/5 HFE-7100/ISOPROPANOL, and one piece was re-tested for hydrophilicity/hydrophobicity using drops of deionized water. The water drops again wetted out the wafer surface, indicating that the 95/5 HFE-7100/ISOPROPANOL rinse did not adversely affect the hydrophilic nature of the clean silicon oxide layer on the wafer surface by redepositing significant hydrocarbon contamination.

One of the oxidatively cleaned wafer pieces was then immersed for approximately 1 to 5 minutes in the test etch cleaning composition. The wafer piece was then removed and the piece was re-tested for hydrophilicity/hydrophobicity using drops of deionized water. The following qualitative water repellency rating system was adopted:

GOOD—the water drops beaded up and easily rolled off the wafer surface.

FAIR—the water drops showed some wetting of the wafer surface but the wetting was incomplete.

POOR—the water drops easily and completely wet the entire wafer surface.

The more repellent the silicon wafer, the better the etch cleaning composition removed the silicon oxides or converted the oxides to elemental silicon or silicon hydrides.

Examples 1–7

Cleaning Compositions A–I, having variations in the composition of each component (i.e., the fluorinated solvent, the anhydrous hydrogen fluoride or complex therof, and the co-solvent) were evaluated for their ability to clean a test silicon wafer using the Wafer Cleaning/Water Repellency Test Procedure. Results from these evaluations, shown as qualitative water repellencies, are presented in TABLE 1.

TABLE 1

| Etch Cleaning Ex. Composition | Content of Composition | Qualitative Water Repellency |
|---|---|---|
| 1 Comp. A | 2.0% HF, 1.9% ISOPROPANOL, 96.1% HFE-7100 | Good |
| 2 Comp. B | 2.3% HF, 2.3% ISOPROPANOL, 65.2% HFE-7200, 30.2% HFB-7100 | Good |
| 3 Comp. C | 2.3% HF, 1.9% ISOPROPANOL, 65.5% VERTREL ™ XF, 30.3% HFE-7100 | Good |
| 4 Comp. D | 2.0% HF, 2.27% ethyl alcohol, 0.03% methyl alcohol, 30.3% VERTREL ™ XF, 65.4% HFE-7100 | Good |
| 5 Comp. E | 4.5% pyridine poly-hydrofluoride, 4.8% ISOPROPANOL, 90.7% HFE-7100 | Fair |
| 6 Comp. F | 4.9% triethylamine tris-hydrofluoride, 4.8% ISOPROPANOL, 90.3% HFE-7100 | Poor |
| 7 Comp. G | 0.2% ammonium bifluoride, 5.0% ISOPROPANOL, 94.8% HFE-7100 | Poor |

The repellency data in TABLE 1 indicate that the compositions containing anhydrous HF (Examples 1–4) all demonstrated good etch cleaning performance, while the composition containing the anhydrous pyridine HF complex (Example 5) performed but not as well. Compositions containing anhydrous HF complexes of triethylamine and ammonia (Examples 6 and 7, respectively), demonstrated etching. Both isopropyl and ethyl alcohol performed effectively as co-solvents in the etch cleaning formulations.

All the fluorinated solvents listed in TABLE 1 (two hydrofluoroethers and one hydrofluorocarbon—all containing at least one hydrogen atom) could be used to formulate satisfactory etch cleaning compositions. However, attempts to make homogeneous mixtures using perfluorocarbons (such as perfluorohexane, perfluoro(2-butyltetrahydrofuran) and perfluoro(tributylamine)), with anhydrous HF and isopropanol were all unsuccessful as both the HF and ISOPROPANOL demonstrated very poor solubility in all the perfluorocarbons.

Comparative Example C1 and Examples 8–15

In Comparative Example C1, Composition H, a state-of-the-art aqueous HF etch cleaning composition containing 0.49% HF, was evaluated for cleaning rate in removing a thermally grown oxide on a silicon wafer. To conduct the etch cleaning rate study, an oxidized silicon wafer was first prepared, having a thermally grown silicon dioxide layer of approximately 10,000 angstroms thickness. The silicon wafer used was a 4 inch (100 mm) diameter wafer, available from MEMC Electronic Materials. Thermal oxidation of the wafer was carried out at 1000° C. for approximately 5 hours in humidified oxygen gas. The actual oxide layer thickness was measured using a NANOMETRICS™ Nano Spec/AFT 180 ellipsometer (available from Nanometrics, Inc., Sunnyvale, Calif.); five measurements were taken on the wafer and the mean oxide layer thickness was calculated and recorded. The oxidized wafer was then broken into several smaller pieces, and one piece was placed in a 2 in (5 cm)

square polyethylene tray along with approximately 40 mL of Composition H. A stopwatch was started and the oxidized wafer was allowed to etch for 2 minutes. The wafer was then removed from the etch cleaning composition and was rinsed for 2 minutes by immersion in DI water. The oxide layer thickness was re-measured using the ellipsometer, so that the etch cleaning rate in angstroms/minute could be calculated.

In Example 8, essentially the same etch cleaning rate study was conducted as described in Comparative Example C1, except that non-aqueous Composition I was substituted for aqueous Composition H and rinsing was done for 2 minutes by immersion in 95/5 HFE-7100/ISOPROPANOL. Composition I was allowed to sit on the shelf for 1 month before evaluation.

In Examples 9–15, Composition I was treated as a concentrate composition and was diluted at various ratios with HFE-7100 before conducting essentially the same etch cleaning rate study as described in Comparative Example C1. Again, rinsing was done for 2 minutes with 95/5 HFE-7100/ISOPROPANOL.

Results from Comparative Example C1 and Examples 8–15 are presented in TABLE 2. The percentages of HF, HFE-7100, ISOPROPANOL and $H_2O$ contained in each etch cleaning composition are also depicted.

TABLE 2

| Ex. | Comp. I/ HFE-7100 | % HF (by titration) | % IPA | % HFE-7100 | % $H_2O$ | Etch Rate (ang/min) |
|---|---|---|---|---|---|---|
| 8 | 1/0 | 1.3 | 1.9 | 96.8 | — | 2687 |
| 9 | 1/3 | 0.33 | 0.48 | 99.19 | — | 1428 |
| 10 | 1/9 | 0.13 | 0.19 | 99.68 | — | 845 |
| 11 | 1/18 | 0.07 | 0.10 | 99.83 | — | 421 |
| 12 | 1/99 | 0.013 | 0.019 | 99.968 | — | 183 |
| 13 | 1/198 | 0.007 | 0.010 | 99.983 | — | 102 |
| 14 | 1/308 | 0.0043 | 0.0062 | 99.9845 | — | 46 |
| 15 | 1/554 | 0.0024 | 0.0035 | 99.9941 | — | 28 |
| C1 | N/A* | 0.49 | — | — | 99.51 | 42 |

*Not applicable - Composition H was the aqueous HF control

The data in TABLE 2 show that the non-aqueous etch cleaning composition containing 0.33% HF (Example 9) gave an etch cleaning rate of the thermally grown oxide layer that was 34 times that shown by the aqueous etch cleaning composition containing 0.49% HF (Composition H—Comparative Example C1). Alternatively, the non-aqueous etch cleaning composition required only 0.0043% HF (Example 14) to produce a comparable etch rate to the aqueous cleaning composition. For the non-aqueous compositions, the etch cleaning rate was fairly linear with concentration.

All non-aqueous compositions performed well, despite the fact that Composition I was allowed to age for one month at room temperature before dilution and evaluation.

Example 16 and Comparative Examples C2–C3

This series of experiments was run to illustrate the use of higher levels of alcohol to quench the non-aqueous HF etch cleaning process.

In Example 16, essentially the same etch cleaning rate study was conducted as described in Comparative Example C1, except that the etch cleaning composition was Composition A and rinsing was done for 2 minutes with 95/5 HFE-7100/ISOPROPANOL.

In Comparative Example C2, essentially the same etch cleaning rate study was conducted as described in Comparative Example C1, except that the etch cleaning composition used was Composition A diluted with 95/5 HFE-7100/ISOPROPANOL at a ratio of 75/25 and rinsing was done for 2 minutes with 95/5 HFE-7100/ISOPROPANOL.

In Comparative Example C3, essentially the same etch cleaning rate study was conducted as described in Comparative Example C1, except that the etch cleaning composition used was Composition A diluted with 95/5 HFE-7100/ISOPROPANOL at a ratio of 50/50 and rinsing was done for 2 minutes with 95/5 HFE-7100/ISOPROPANOL.

In Comparative Example C4, essentially the same etch cleaning rate study was conducted as described in Comparative Example C1, except that the etch cleaning composition used was 95/5 HFE-7100/ISOPROPANOL and rinsing was done for 2 minutes with 95/5 HFE-7100/ISOPROPANOL.

Results from Example 16 and Comparative Examples C2–C4 are presented in TABLE 3. The percentages of HF, HFE-7100 and ISOPROPANOL and for each cleaning composition are also depicted.

TABLE 3

| Ex. | Ratio of Comp. A to 95/5 HFE-7100/IPA | % HF (by titration) | % IPA | % HFE-7100 | Etch Rate (ang/min) |
|---|---|---|---|---|---|
| 16 | 1/0 | 1.64 | 1.9 | 96.1 | 289 |
| C2 | 3/1 | 1.23 | 2.7 | 95.8 | 0 |
| C3 | 1/1 | 0.82 | 3.5 | 95.5 | 0 |
| C4 | 0/1 | — | 5 | 95 | 0 |

The data in TABLE 3 show that levels of ISOPROPANOL at 2.7% or more effectively quenched the etch cleaning process, even when levels of HF were as high as 1.23%.

Examples 17–19 and Comparative Examples C5–C8

This series of experiments was run in a class 10 clean room environment to show that silicon wafers cleaned by the etch cleaning compositions of this invention exhibit low particle contamination of the wafer surface after cleaning. The wafer used in each experiment was a 200 mm prime silicon wafer, P/Boron, 1-0-0, notched, 0–100 resistivity, 750±50μ front side polished, particles: 35 or less at 0.2μ, having an native silicon oxide layer of approximately 10 angstroms; available from Seaway Semiconductor, Inc., Livermore, Calif. The total particle count (including particle sizes ranging from 0.2 to 1.6 microns in diameter) on each wafer surface was measured by scanning with a SURFS-CAN™ 6220 Wafer Inspection System (available from Tencor Instruments, Mountain View, Calif.).

For Comparative Example C5, the initial particle count was measured. No etch cleaning or rinsing of the wafer was performed and used as a control.

In Example 17, a silicon wafer was etch cleaned for 3 minutes with a solution consisting of 0.01% Composition A in HFE-7100. No rinsing cycle was employed. The total particle count on the wafer surface was measured after the wafer had dried.

In Example 18, a silicon wafer was etch cleaned for 3 minutes with a solution consisting of 1/99 Composition A/hFE-7100, followed by a 2 minute rinsing cycle with HFE-7100. The total particle count on the wafer surface was measured after the wafer had dried.

In Example 19, a silicon wafer was cleaned for 3 minutes with a solution consisting of 0.01% Composition A in HFE-7100, followed by a 2 minute rinsing cycle with 95/5 HFE-7100/ISOPROPANOL. The total particle count on the wafer surface was measured after the wafer had dried.

In Comparative Example C6, a silicon wafer was cleaned for 3 minutes with a solution consisting of Composition H (0.49% aqueous HF). No rinsing cycle was employed. The total particle count on the wafer surface was measured after the wafer had dried.

In Comparative Example C7, a silicon wafer was cleaned for 3 minutes with a solution consisting of Composition H (0.49% aqueous HF), followed by a 2 minute rinsing cycle with DI water. The total particle count on the wafer surface was measured after the wafer had dried.

In Comparative Example C8, a silicon wafer was etch cleaned for 3 minutes with a solution consisting of Composition H (0.49% aqueous HF), followed by a 2 minute rinsing cycle with 95/5 HFE-7100/ISOPROPANOL. The total particle count on the wafer surface was measured after the wafer had dried.

Results of the particle counts for Examples 17–19 and Comparative Examples C5–C8 are presented in TABLE 4.

TABLE 4

| Ex. | Etch Cleaning Composition | Rinsing Composition | Total Part. Count |
|---|---|---|---|
| C5 | No Etch | No Rinse | 2 |
| 17 | 1/100 Comp. A/HFE-7100 | No Rinse | 661 |
| 18 | 1/100 Comp. A/HFE-7100 | HFE-7100 | 959 |
| 19 | 1/100 Comp. A/HFE-7100 | 95/5 HFE-7100/IPA | 3144 |
| C6 | Comp. H (0.49% aqueous HF) | No Rinse | 6211 |
| C7 | Comp. H (0.49% aqueous HF) | DI water | 16266 |
| C8 | Comp. H (0.49% aqueous HF) | 95/5 HFE-7100/IPA | 6820 |

The data in TABLE 4 show that the particle count on the silicon wafer after cleaning the silicon oxide layer is dependent upon both the etch cleaning and rinsing processes. In all cases, the particle count is lower when the anhydrous HF etch cleaning process of this invention is employed as compared to the state-of-the-art aqueous HF etch cleaning process. The lowest post-cleaning particle count (661) was observed in Example 17, using the anhydrous HF etch cleaning process with no rinse. This represented a nearly 90% reduction in particle count when compared to that of Comparative Example C6, using the aqueous HF etch cleaning process with no rinse (6211).

The particle count experiments run in TABLE 4 also provided information concerning average distribution of particle sizes after etch cleaning, which is presented in TABLE 5.

TABLE 5

| | Total Particle Count for: | | | | | |
|---|---|---|---|---|---|---|
| Distribution (microns): | Ex. 17 | Ex. 18 | Ex. 19 | C. Ex. C6 | C. Ex. C7 | C. Ex. C8 |
| 0.200–0.213 | 80 | 134 | 489 | 767 | 1841 | 885 |
| 0.213–0.284 | 241 | 320 | 854 | 2274 | 6167 | 1928 |
| 0.284–0.379 | 179 | 250 | 832 | 1418 | 4061 | 1772 |
| 0.379–0.506 | 95 | 112 | 235 | 311 | 931 | 469 |
| 0.506–0.674 | 52 | 85 | 175 | 370 | 877 | 442 |
| 0.674–0.900 | 9 | 32 | 161 | 307 | 767 | 415 |
| 0.900–1.200 | 7 | 14 | 149 | 263 | 620 | 335 |
| 1.200–1.600 | 7 | 19 | 254 | 507 | 965 | 575 |

The data in TABLE 5 indicate that the anhydrous HF etch cleaning compositions of this invention reduce the particle count in all the size ranges as compared to the aqueous HF cleaning compositions. This is a very important result as even very small particles can be disadvantageous.

Microelectromechanical Device Examples

Preparation of Silicon Wafers Having Unreleased Micromirrors without Etch Holes:

Etch-hole free mirrors supported on silicon wafers were fabricated within the MUMPs (a trade designation for a standard MEMS fabrication process) of Cronos Integrated Microsystems of Morristown, N.C., USA (a subsidiary of JDS Uniphase Corp.).

The MUMPs process consisted of the deposition and patterning of a series of layers of silicon nitride, polycrystalline silicon, phosphosilicate glass, and gold with a thin chromium adhesion layer. The layers were deposited on a silicon substrate in the following order and nominal thicknesses: 0.6 micrometer silicon nitride layer, 0.5 micrometer polycrystalline silicon layer, 2.0 micrometers phosphosilicate glass layer, 2.0 micrometers polycrystalline silicon layer, 0.75 micrometers phosphosilicate glass layer, 1.5 micrometers polycrystalline silicon layer, and 0.5 micrometer Cr/Au metal layer.

Figure 2:
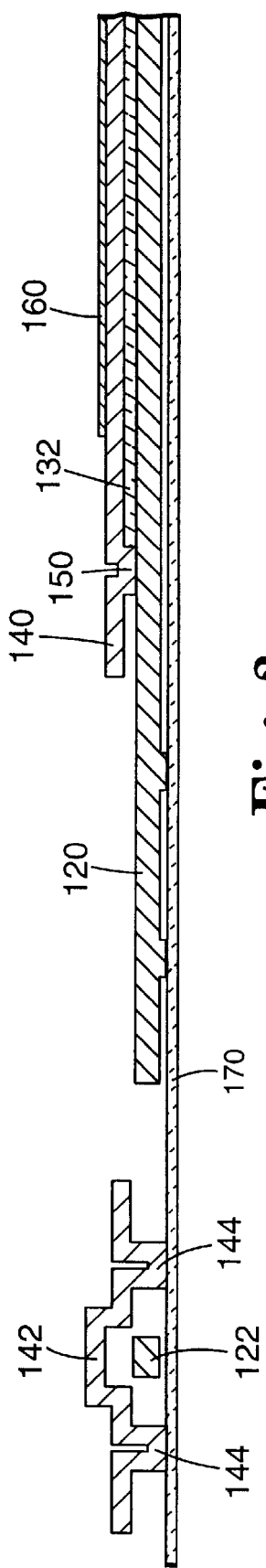
FIG. 2 is cross-sectional view of a released microelectromechanical device used in the Examples.

According to the MUMPs process, three hole-free micromirror structures shown in FIGS. 1 and 2 were fabricated onto a single silicon wafer in an unreleased (i.e. unetched). The micromirrors consisted of 375 micrometers×406 micrometers plates of polycrystalline silicon plate layer 120, hinged to the substrate at one end by a series of 10 micrometers×27 micrometers straps of polycrystalline silicon layer 142 over a 3 micrometer wide pin of polycrystalline silicon layer 122, as shown. Pin 122 is connected to the silicon plate 120 by polycrystalline silicon fingers 126. Straps 142 are each anchored to the silicon nitride layer 170 by two anchors 144 located on both sides of pin 122.

Above the polycrystalline silicon plate 120 was a 348.5 micrometer×382 micrometer polycrystalline silicon plate 140. The polycrystalline silicon plate 140 overhung the polycrystalline silicon plate 120 such that the total width of the etch hole-free structure to be released was 390 micrometers. The two polysilicon plates 120 and 140 were joined near the perimeter of polycrystalline silicon plate 140 by a via 150. Within this via a 298 micrometers×364 micrometers layer of polysilicate glass layer is trapped (denoted 132). On the region of 140 above the trapped polysilicate glass layer was a 282 micrometers×356 micrometers metal layer 160. Outside via 150 were a series of dimples 124 in the polycrystalline silicon plate 120, which were approximately 0.75 micrometer thick bumps on the bottom of the polycrystalline silicon plate 120 designed to reduce adhesion of the polycrystalline silicon plate 120 to the underlying layer.

Not shown in FIG. 1 is a 292 micrometers×376 micrometers polycrystalline silicon layer used to shape the layers that make up the mirror, to give greater structural rigidity. It will be understood that other constructions and other dimensions of the individual layers may be used without departing from the scope and spirit of this invention.

Example 20 and Comparative Examples C9 and C10

This example demonstrates the fabrication of etch hole-free micromirrors.

MEMS chips (prepared using the MUMPS process from Cronos Microsystems of Morrisville, N.C., USA) were etched using the following three etchants to release micromirrors from the substrate. The chips had unreleased micromirrors hinged along one edge (shown in FIG. 1). The micromirrors consisted of 2 layers of polysilicon (bottom layer was 2 micrometers thick, top layer 1.5 micrometers thick separated by a 0.75 micrometer thick layer of phosphosilicate glass) and were vapor coated with a 0.5 micrometer thick layer of gold. The device pattern included three micromirror planar element having no etch holes over an rectangular area of 390 micrometers×406 micrometers on each chip.

| Etchant A | 49 wt. % HF in deionized water |
| Etchant B | 2 wt. % HF in deionized water |
| Etchant C | 2 wt. % HF in HFE + 2.6% isopropanol |

The etch removed the sacrificial 5% phosphosilicate glass generated during device fabrication. The MEMS chips were etched under conditions corresponding to 115% of the theoretical etch time necessary to completely release the micromirrors.

Comparative Example C9

A MEMS chip was etched using the following steps in order (all fluid volumes approximately 300–500 ml): a) the chip was mounted in an etch holder, b) the device was cleaned by sonication in acetone for 20 minutes using a GENESIS model 4HT-1014-6 ultrasonic generator (dial setting 2.5, available from Crest Ultrasonics Corp. of Trenton N.J., USA) followed by sonication in isopropanol for 5 minutes, and c) subsequently etched by soaking for 15 min in Etchant A, 10 minutes in deionized water, and 5 min isopropanol then dried 10–15 minutes in a 110° C. oven. The etched chip was mounted on a 75 mm support wafer with double-stick tape.

Comparative Example C10

An identical MEMS chip was etched using the following steps in order (all fluid volumes approximately 300–500 ml): a) the chip was mounted in an etch holder, b) the device was cleaned by sonication in acetone for 20 minutes as in Example 1 followed by sonication in isopropanol for 5 minutes, and c) subsequently etched by soaking for 45 min in Etchant B, 10 minutes in deionized water, and 5 min isopropanol then dried 10–15 minutes in a 110° C. oven. The etched chip was mounted on a 75 mm support wafer with double-stick tape. In this Example the etch hole-free micromirrors were not released from the wafer.

Example 20

Another identical MEMS chip was etched using the following steps in order (all fluid volumes approximately 300–500 ml): a) the chip was mounted in an etch holder, b) the device was cleaned by sonication in acetone for 20 minutes as in Example 1 followed by sonication in isopropanol for 5 minutes, and c) subsequently etched by soaking for 45 min in Etchant C, 15 min isopropanol then dried 10–15 minutes in a 110° C. oven. The etched chip was mounted on a 75 mm support wafer with double-stick tape.

The support wafers for Examples 1–3 were put in individual FLUOROWARE wafer carriers (available from Entegris, Inc. of Chaska, Minn.) and transported for analysis. Optical microscopy showed that the devices from Examples 1 and 3 released the etch hole-free micromirrors. Example 2 did not release the hole-free micromirrors, nor did it even release control micromirrors having 30 micrometer-spaced etch holes. Also, it appeared that more pitting of the gold layer occurred in Example 1 than in either of the other examples.

One week later, all (3) of the etch hole-free micromirror devices of Comparative Example C9 were observed to have broken off. By comparison none (0) of the etch hole-free micromirror devices of Example 20 were broken off after 1 week, although the chips were handled similarly. The breaking point was at the hinges, where the mirrors were held to the substrate by a single 1.5 micrometer thick layer of polysilicon.

Discussion

This HF/HFE solution could be used to release structures of almost any size. Assuming a practical limit of four hours of etching, one could free structures requiring up to 1 mm of lateral etching of a 2 micrometer thick PSG layer, allowing for a 15% overetch. (Etch speeds will vary depending upon the composition and thickness of the sacrificial layer.) Structures requiring 1 mm of lateral etching would include circular plates of 1 mm radius, and rectangular beams of arbitrary length up to 2 mm wide. MEMS structures are not typically so large. A more typical structure would be a circular mirror of approximately 500 micrometers diameter, which could be etched by this technique in approximately 1 hour, including a 15% over-etch.

What is claimed is:

1. A method of etching and releasing a microelectromechanical device comprising contacting said device with an essentially anhydrous cleaning composition comprising 88 weight percent or more of a fluorinated solvent, from 0.005 to 2 weight percent of hydrogen fluoride or complex thereof, and 30 weight percent or less of a co-solvent.

2. The method of claim 1 further comprising the step of separating the processed substrate from said composition.

3. The method of claim 1 wherein said composition etches said substrate and releases the microelectromechanical device.

4. The method of claim 1 wherein said composition contacts said substrate for a time sufficient to achieve a predetermined degree of etching.

5. The method of claim 2 further comprising the step of quenching said etching by additional an excess amount of alcohol.

6. The method claim 1 having an etch rate of at least 28 angstroms/minute.

7. The method of claim 1 further comprising the step of rinsing said substrate with a fluorinated liquid.

8. The method of claim 1 wherein said device is a micro mirror.

9. The method of claim 1 wherein said device is etched and released from a microelectromechanical device encased in a sacrificial layer.

10. A method for preparing a microelectromechanical devices comprising the steps of;
   providing a silicon wafer containing an unreleased device;
   contacting the wafer with an essentially anhydrous cleaning composition comprising 88 weight percent or more of a fluorinated solvent, from 0.005 to 2 weight percent of hydrogen fluoride or complex thereof, and 30 weight percent or less of a co-solvent for a time sufficient to etch and release said device.

11. The process of claim 10 wherein said device has a critical etch distance of 40 micrometers or more.

12. The process of claim 11 wherein said critical etch distance is 40 to 400 micrometers.

13. The method of claim 10 wherein said microelectromechanical devices has no etch holes.

14. The method of claim 13 wherein said co-solvent is selected from the group consisting of aliphatic and aromatic hydrocarbons, ethers, polyethers, carboxylic acids, primary and secondary alcohols, and hydrochlorocarbons.

15. A microelectromechanical device prepared by the method of claim 1.

16. The method of claim 10 wherein said unreleased microelectromechanical device has a critical etch distance of 40 to 400 micrometers.

17. The fluorinated solvent of claim 14 selected from $CF_3CFHCFHCF_2CF_3$, $C_5F_{11}H$, $C_6F_{13}H$, $CF_3CH_2CF_2H$, $CF_3CF_2CH_2CH_2F$, $CHF_2CF_2CF_2CHF_2$, 1,2-dihydroperfluorocyclopentane and 1,1,2-trihydroperfluorocyclopentane.

* * * * *

UNITED STATES PATENT AND TRADEMARK OFFICE
CERTIFICATE OF CORRECTION

PATENT NO. : 6,492,309 B1
DATED : December 10, 2002
INVENTOR(S) : Behr, Frederick E.

It is certified that error appears in the above-identified patent and that said Letters Patent is hereby corrected as shown below:

Column 4,
Line 2, delete "MUMs" and insert -- MUMPs --.

Column 8,
Line 3, after "thereof" insert -- . --.

Column 11,
Line 20, delete "nitrites" and insert -- nitriles --.

Column 12,
Line 24, delete "$CF_3CH_2CF_2CH_2CH_3$" and insert -- $CF_3CH_2CF_2CH_3$ --.
Line 32, after "$CHF_2CF_2CF(CF_3)_2$" insert -- ; --.
Line 46, delete "$CH_3(CH_2)_6CH_3$" and insert -- $CH_3(CF_2)_6CH_3$ --.

Column 13,
Line 55, delete "H" and insert -- HF --.

Column 16,
Line 60, delete "$3^{TM}$" and insert -- $3M^{TM}$ --.

Column 17,
Line 4, delete "$3^{TM}$" and insert -- $3M^{TM}$ --.

Column 18,
Line 1, delete "therof" and insert -- thereof --.

Column 20,
Line 60, delete "A/hFE-7100" and insert -- A/HFE-7100 --.

UNITED STATES PATENT AND TRADEMARK OFFICE
CERTIFICATE OF CORRECTION

PATENT NO. : 6,492,309 B1
DATED : December 10, 2002
INVENTOR(S) : Behr, Frederick E.

It is certified that error appears in the above-identified patent and that said Letters Patent is hereby corrected as shown below:

Column 24,
Line 62, delete "claim 13" and insert -- claim 1 --.

Signed and Sealed this

Twenty-first Day of February, 2006

JON W. DUDAS
*Director of the United States Patent and Trademark Office*